(12) United States Patent
Xu et al.

(10) Patent No.: US 10,388,570 B2
(45) Date of Patent: Aug. 20, 2019

(54) SUBSTRATE WITH A FIN REGION COMPRISING A STEPPED HEIGHT STRUCTURE

(71) Applicant: International Business Machines Corporation, Armonk, NY (US)

(72) Inventors: Peng Xu, Santa Clara, CA (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/845,594

(22) Filed: Dec. 18, 2017

(65) Prior Publication Data

US 2019/0189518 A1    Jun. 20, 2019

(51) Int. Cl.
| | | |
|---|---|---|
| *H01L 21/8234* | (2006.01) | |
| *H01L 21/762* | (2006.01) | |
| *H01L 29/78* | (2006.01) | |
| *H01L 29/66* | (2006.01) | |
| *H01L 29/06* | (2006.01) | |

(52) U.S. Cl.
CPC .... *H01L 21/823431* (2013.01); *H01L 21/762* (2013.01); *H01L 29/0649* (2013.01); *H01L 29/66795* (2013.01); *H01L 29/785* (2013.01)

(58) Field of Classification Search
CPC ........... H01L 29/785; H01L 21/823431; H01L 29/0649; H01L 29/66795; H01L 21/762
See application file for complete search history.

(56) References Cited

U.S. PATENT DOCUMENTS

| | | |
|---|---|---|
| 7,994,020 B2 | 8/2011 | Lin et al. |
| 8,617,996 B1 | 12/2013 | Chi et al. |
| 8,658,536 B1 | 2/2014 | Choi et al. |
| 8,835,268 B2 | 9/2014 | Sudo |
| 9,147,730 B2 | 9/2015 | Xie et al. |
| 9,209,095 B2 | 12/2015 | Chang et al. |
| 9,269,628 B1 | 2/2016 | Jacob |
| 9,337,050 B1 | 5/2016 | Xie et al. |
| 9,337,101 B1 | 5/2016 | Sung et al. |
| 2014/0252428 A1 | 9/2014 | Chang et al. |
| 2015/0076609 A1* | 3/2015 | Xie ........................ H01L 29/785 257/365 |
| 2015/0279684 A1 | 10/2015 | Wei et al. |

(Continued)

*Primary Examiner* — Matthew L Reames
*Assistant Examiner* — Benjamin T Liu
(74) *Attorney, Agent, or Firm* — Vazken Alexanian; Ryan, Mason & Lewis, LLP (57) ABSTRACT

A method of forming a semiconductor structure includes forming a fin region and a non-fin region surrounding the fin region in a substrate, wherein sidewalls of the fin region comprise a stepped height structure comprising an outer portion adjacent to the non-fin region with a first height and an inner portion with a second height greater than the first height. The method also includes forming a plurality of fins disposed over a top surface of the inner portion of the fin region, forming an isolation layer disposed over the top surface of the inner portion of the fin region surrounding a portion of the sidewalls of the plurality of fins, and forming a fin liner disposed (i) between the isolation layer and the top surface of the inner portion of the fin region and (ii) between the isolation layer and the portion of the sidewalls of the plurality of fins.

10 Claims, 11 Drawing Sheets

(56) References Cited

U.S. PATENT DOCUMENTS

2016/0043223 A1    2/2016  Xie et al.
2016/0133726 A1    5/2016  Sung et al.
2018/0096998 A1*  4/2018  Sung .................. H01L 27/0886

* cited by examiner

SUBSTRATE WITH A FIN REGION COMPRISING A STEPPED HEIGHT STRUCTURE

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming a fin region in a substrate, with the fin region being protected by blocking spacers disposed vertically abutting sidewalls of the fin region to reduce micro-loading effects while etching the substrate to form a plurality of fins in the fin region.

In one embodiment, a method of forming a semiconductor structure comprises forming a fin region and a non-fin region surrounding the fin region in a substrate, wherein sidewalls of the fin region comprise a stepped height structure comprising an outer portion adjacent to the non-fin region with a first height and an inner portion with a second height greater than the first height. The method also comprises forming a plurality of fins disposed over a top surface of the inner portion of the fin region, forming an isolation layer disposed over the top surface of the inner portion of the fin region surrounding a portion of the sidewalls of the plurality of fins, and forming a fin liner disposed (i) between the isolation layer and the top surface of the inner portion of the fin region and (ii) between the isolation layer and the portion of the sidewalls of the plurality of fins.

In another embodiment, a semiconductor structure comprises a substrate comprising a fin region and a non-fin region surrounding the fin region, wherein sidewalls of the fin region comprise a stepped height structure comprising an outer portion adjacent to the non-fin region with a first height and an inner portion with a second height greater than the first height. The semiconductor structure also comprises a plurality of fins disposed over a top surface of the inner portion of the fin region, an isolation layer disposed over the top surface of the inner portion of the fin region surrounding a portion of the sidewalls of the plurality of fins, and a fin liner disposed (i) between the isolation layer and the top surface of the inner portion of the fin region and (ii) between the isolation layer and the portion of the sidewalls of the plurality of fins.

In another embodiment, an integrated circuit comprises a fin field-effect transistor (FinFET) device comprising a substrate comprising a fin region and a non-fin region surrounding the fin region, wherein sidewalls of the fin region comprise a stepped height structure comprising an outer portion adjacent to the non-fin region with a first height and an inner portion with a second height greater than the first height. The FinFET device also comprises a plurality of fins disposed over a top surface of the inner portion of the fin region, an isolation layer disposed over the top surface of the inner portion of the fin region surrounding a portion of the sidewalls of the plurality of fins, and a fin liner disposed (i) between the isolation layer and the top surface of the inner portion of the fin region and (ii) between the isolation layer and the portion of the sidewalls of the plurality of fins.

DETAILED DESCRIPTION

Illustrative embodiments of the invention may be described herein in the context of illustrative methods for forming a fin region comprising a stepped height structure along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A FET is a transistor having a source, a gate, and a drain, and having action that depends on the flow of majority carriers along a channel that runs past the gate between the source and drain. Current through the channel between the source and drain may be controlled by a transverse electric field under the gate. The length of the gate determines how fast the FET switches, and can be about the same as the length of the channel (such as the distance between the source and drain).

In some FETs, more than one gate or multi-gate arrangements may be used for controlling the channel. Multi-gate FETs are promising candidates to scale down complementary metal-oxide-semiconductor (CMOS) FET technology. However, the smaller dimensions associated with multi-gate FETs (as compared to single-gate FETs) necessitate greater control over performance issues such as short channel effects, punch-through, metal-oxide-semiconductor (MOS) leakage current, and the parasitic resistance that is present in a multi-gate FET.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Embodiments provide techniques for minimizing reactive-ion etching (RIE) micro-loading effects in fin cut-first process flows for forming FinFET structures. A uniform array fin pattern is etched in a hard mask layer disposed over a top surface of a substrate. A fin cut mask is patterned over the hard mask, and exposed portions of the hard mask layer are removed. Portions of the substrate exposed by the fin cut mask are then etched, and a spacer is formed on vertical sidewalls of the fin cut pattern etched in the substrate. The fin cut mask is then stripped, leaving behind a remaining pattern of the hard mask in the fin cut region. Exposed portions of the substrate are then etched to form fins, with the spacer providing protection against etch loading effects on end fins in the fin array pattern. A fin liner is then formed, along with an isolation layer. The fin liner and isolation layer are recessed to a desired depth to reveal a controlled height of the fins, which are subject to further processing for FinFET fabrication.

Embodiments advantageously provide for fabrication of a unique structure, wherein blocks are formed outside of active fins to improve a "last" fin profile of the side fins in a fin region. Further, the structure has a "stepped" height structure between fin and non-fin regions. Examples of such structural features and illustrative processes for forming such structural features will now be described with respect to FIGS. 1-19.

Figure 1:
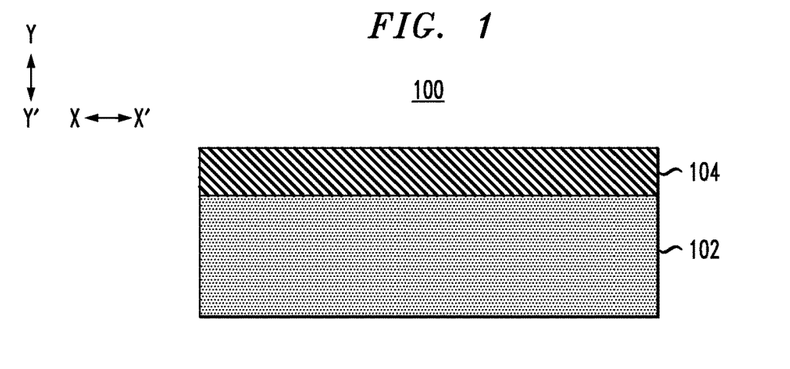
FIG. 1 depicts a side cross-sectional view of a semiconductor structure comprising a substrate with a hard mask disposed over a top surface thereof, according to an embodiment of the invention

FIG. 1 depicts a side cross-sectional view 100 of a semiconductor structure, comprising a substrate 102 and a hard mask 104 disposed over the substrate 102. In some embodiments, the substrate 102 comprises a semiconductor substrate formed of silicon (Si), although other suitable materials may be used. For example, the substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The hard mask 104 is disposed over a top surface of the substrate 102. The hard mask 104 may be formed of silicon nitride (SiN) although other suitable materials may be used. In various embodiments, the hard mask 104 may be an oxide such as silicon oxide (SiO), a nitride such as SiN, or an oxynitride such as silicon oxynitride (SiON), silicon oxycarbide (SiOC), silicon boron carbide nitride (SiBCN), silicon carbonitride (SiCN), or combinations thereof. In various embodiments, the hard mask 104 may be silicon nitride (SiN), for example, $Si_3N_4$. The hard mask 104 can be deposited on the substrate 102 by any suitable deposition technique, including but not limited to, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), physical vapor deposition (PVD), sputtering, plating, evaporation, spin-on-coating, ion beam deposition, electron beam deposition, laser assisted deposition, chemical solution deposition, or any combination of those methods. In some embodiments, the hard mask 104 is deposited by CVD.

Figure 2:
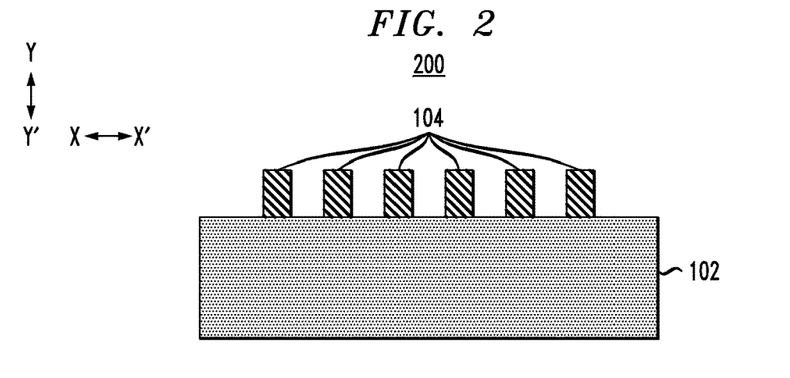
FIG. 2 depicts a side cross-sectional view of the FIG. 1 semiconductor structure following patterning of the hard mask, according to an embodiment of the invention.

FIG. 2 depicts a side cross-sectional view 200 of the FIG. 1 structure, following patterning of the hard mask 104. The hard mask 104 is patterned, for example, by lithography followed by etching. Other suitable techniques such as sidewall image transfer (SIT), self-aligned double patterning (SADP), self-aligned quadruple patterning (SAQP), etc. may be used to pattern hard mask 104.

Figure 3:
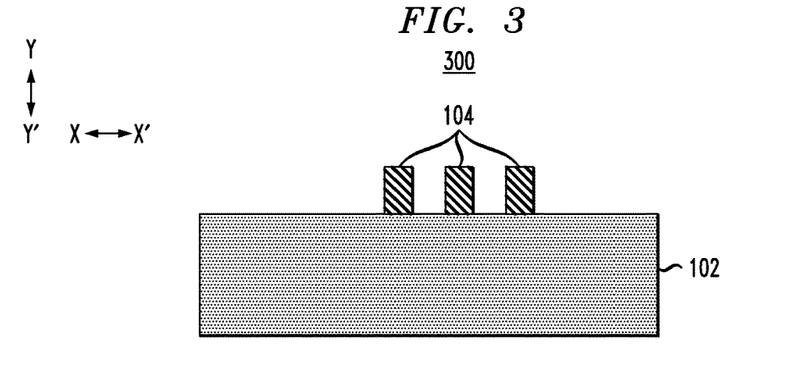
FIG. 3 depicts a side cross-sectional view of the FIG. 2 semiconductor structure following removal of portions of the hard mask using a fin cut mask, according to an embodiment of the invention.

FIG. 3 depicts a side cross-sectional view 300 of the FIG. 2 structure, following removal of portions of the hard mask 104, leaving a plurality of hard mask pillars that will be used to form fins in a fin region. One or more fin cut masks (not shown) may be used to remove portions of the hard mask 104.

Figure 4:
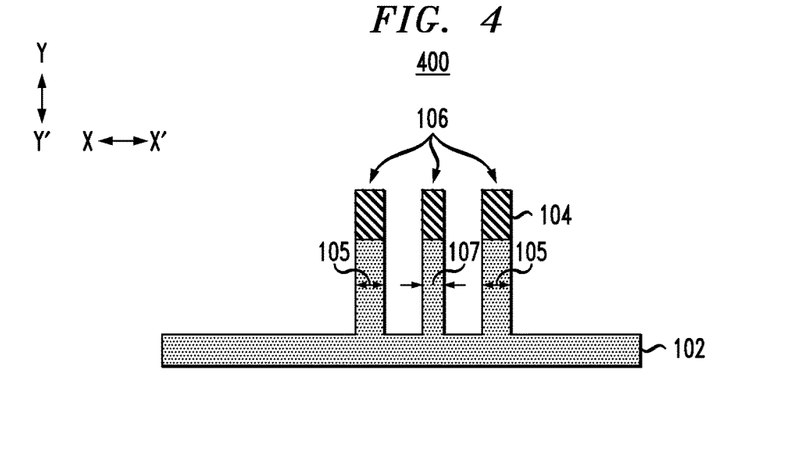
FIG. 4 depicts a side cross-sectional view of the FIG. 3 structure following formation of fins with side fins of a fin region having larger channel dimension than interior or center fins in the fin region, according to an embodiment of the invention.

FIG. 4 depicts a side cross-sectional view 400 of the FIG. 3 structure, following formation of fins 106 by etching exposed portions of the substrate not covered by remaining portions of the hard mask 104. As illustrated, fins on the sides of the fin region (e.g., "isolated" fins) have a larger channel dimension (CD) 105 than the CD of interior 107 or central fins of the fin region (e.g., "dense" fins).

Figure 5:
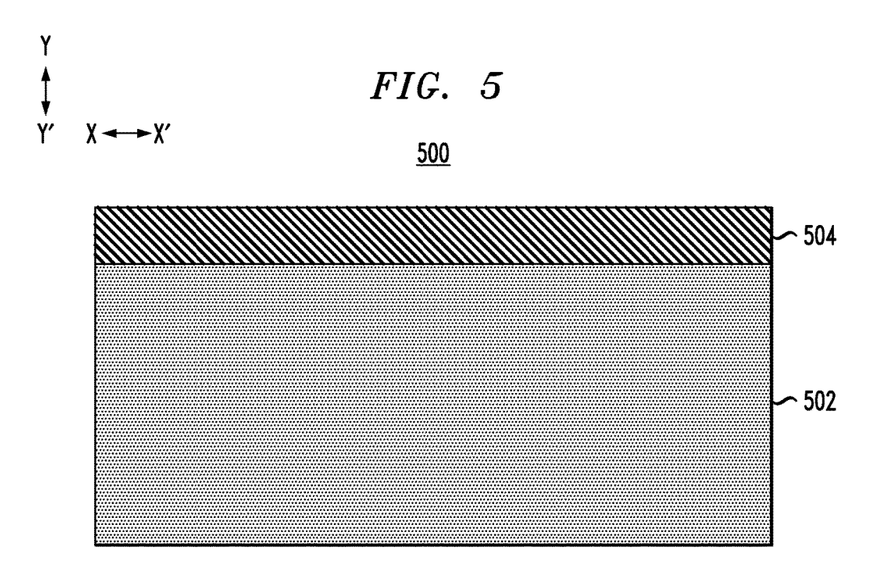
FIG. 5 depicts a side cross-sectional view of a semiconductor structure comprising a substrate with a hard mask disposed over a top surface thereof, according to an embodiment of the invention.

FIG. 5 depicts a side cross-sectional view 500 of a semiconductor structure comprising a substrate 502 with a hard mask 504 disposed over a top surface thereof. The substrate 502 and hard mask 504 may be formed of materials similar to those described above with respect to the substrate 102 and hard mask 104, respectively. The substrate 502 may have a width or horizontal thickness (in direction X-X') that varies, such as based on the desired number of fins and/or fin regions to be formed thereon. The substrate 502 may have a height or vertical thickness (in direction Y-Y') ranging from 0.5 millimeters (mm) to 1 mm, although other thicknesses that are greater or less than this range may be employed as desired depending on the particular application. The hard mask 504 may have a height or vertical thickness (in direction Y-Y') ranging from 50 nanometers (nm) to 100 nm, although other thicknesses that are greater or less than this range may be employed as desired depending on the particular application.

Figure 6:
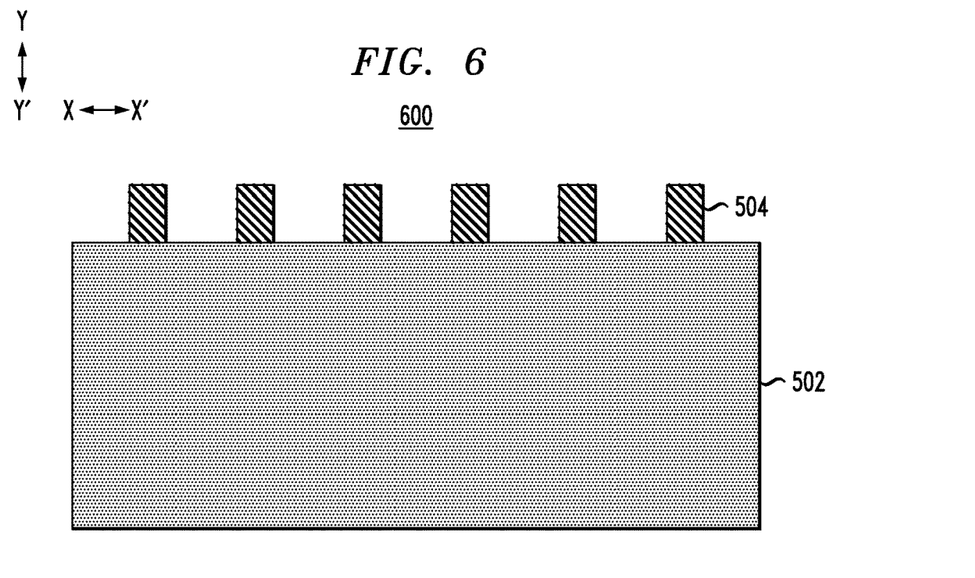
FIG. 6 depicts a side cross-sectional view of the FIG. 5 structure following patterning of the hard mask to form hard mask pillars disposed on the top surface of the substrate, according to an embodiment of the invention.

FIG. 6 depicts a side cross-sectional view 600 of the FIG. 5 structure, following patterning of the hard mask 504 as illustrated. The hard mask 504 may be patterned using various sidewall image transfer (SIT) techniques, such as self-aligned double patterning (SADP), double SADP also referred to as self-aligned quadruple patterning (SAQP), etc. Alternatively, the hard mask 504 can be patterned by lithography (e.g., extreme ultraviolet (EUV) lithography) followed by etching processes, or using other suitable techniques including those described above with respect to patterning of hard mask 104. As a result of the patterning, the remaining portion of the hard mask 504 forms a number of hard mask pillars disposed on the top surface of the substrate 502. Each hard mask pillar may have a width or horizontal thickness (in direction X-X') ranging from 8 nm to 16 nm, although other widths that are greater or less than this range may be employed as desired depending on the particular application.

Figure 7:
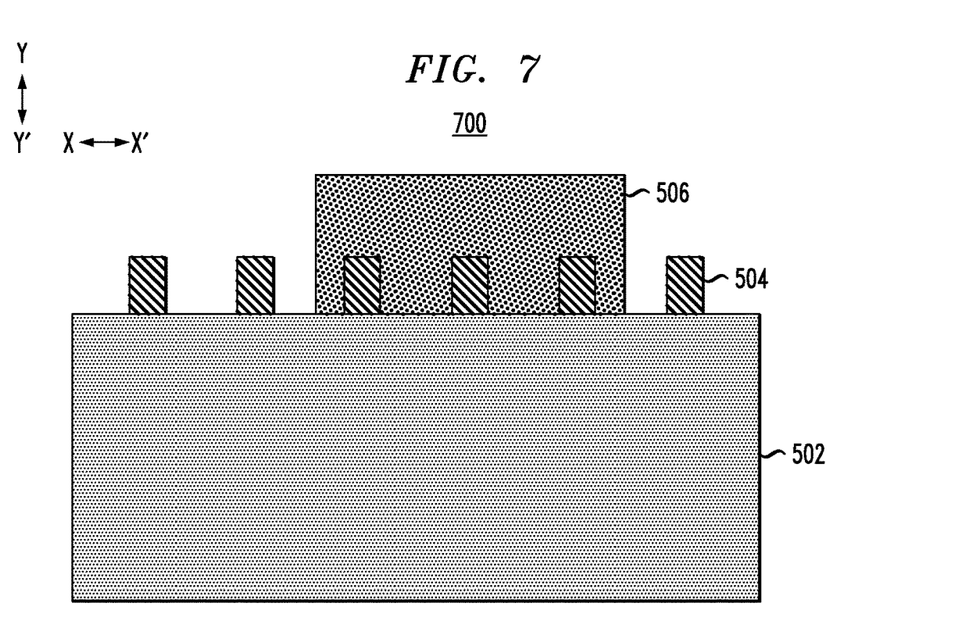
FIG. 7 depicts a side cross-sectional view of the FIG. 6 structure following patterning of a fin cut mask, according to an embodiment of the invention.

FIG. 7 depicts a side cross-sectional view 700 of the FIG. 6 structure following patterning of a fin cut mask 506 over a subset or portion of the hard mask pillars 504 disposed over the top surface of the substrate 502. The fin cut mask 506 defines a fin cut region as will be described in further detail below. In the FIG. 7 example, three of the hard mask pillars 504 are covered by the fin cut mask 506. It is to be appreciated, however, that any desired number of hard mask pillars 504 may be covered by the fin cut mask 506 based on a desired number of fins to be formed in a given fin cut region. It is also to be appreciated that multiple fin masks may be formed, so as to form a number of resulting fin regions.

The fin cut mask 506 may be formed of amorphous silicon (a-Si), polycrystalline silicon (poly-Si), or amorphous carbon, although other suitable materials may be used. The fin cut mask 506 may be formed by deposition followed by a patterning process such as lithography and etch processing. The fin cut mask 506 may have a width or horizontal thickness (in direction X-X') sufficient to cover a desired number of hard mask pillars 504 for a fin region that will be formed. The fin cut mask 506 may have a height or vertical thickness (in direction Y-Y') that exceeds that of the hard mask pillars 504, such as a height in the range 60 nm to 150 nm, although other heights that are greater or less than this range may be employed as desired depending on the particular application.

Figure 8:
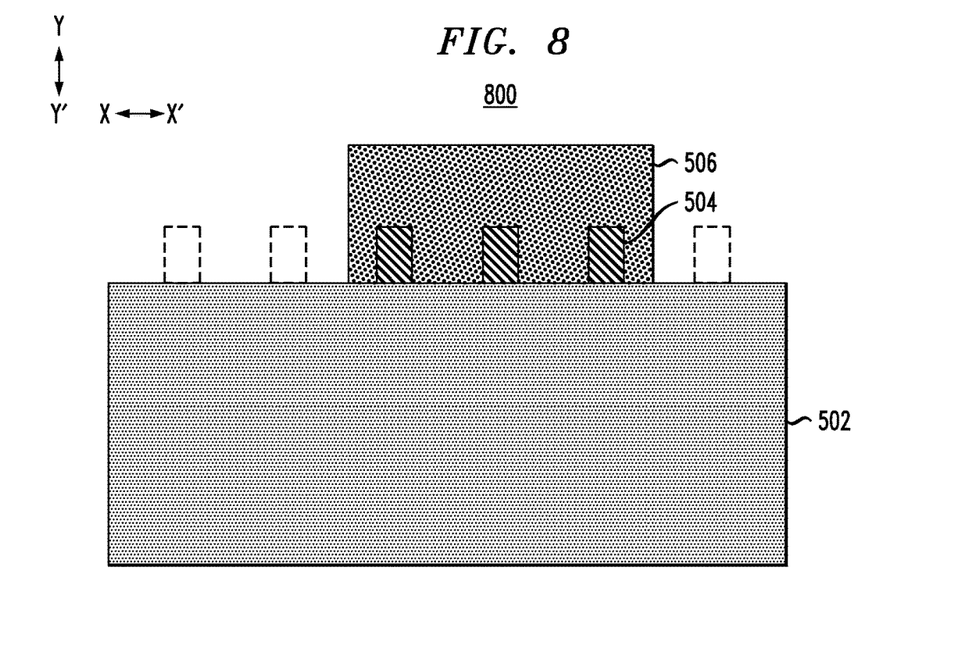
FIG. 8 depicts a side cross-sectional view of the FIG. 7 structure following removal of hard mask pillars exposed by the fin cut mask, according to an embodiment of the invention.

FIG. 8 depicts a side cross-sectional view 800 of the FIG. 7 structure following removal of exposed portions of the patterned hard mask 504 (e.g., hard mask pillars that are not protected by the fin cut mask 506). The removed hard mask pillars are shown in dashed outline in FIG. 8 for clarity of illustration. The hard mask pillars not protected by the fin cut mask 506 may be removed, for example, by etch processing. In some embodiments, the hard mask 506 comprises SiN and the exposed hard mask pillars 504 can be removed by a SiN etch process such as wet etch with a solution containing phosphoric acid or dry etch (e.g., a SiN reactive-ion etching (RIE) process).

Figure 9:
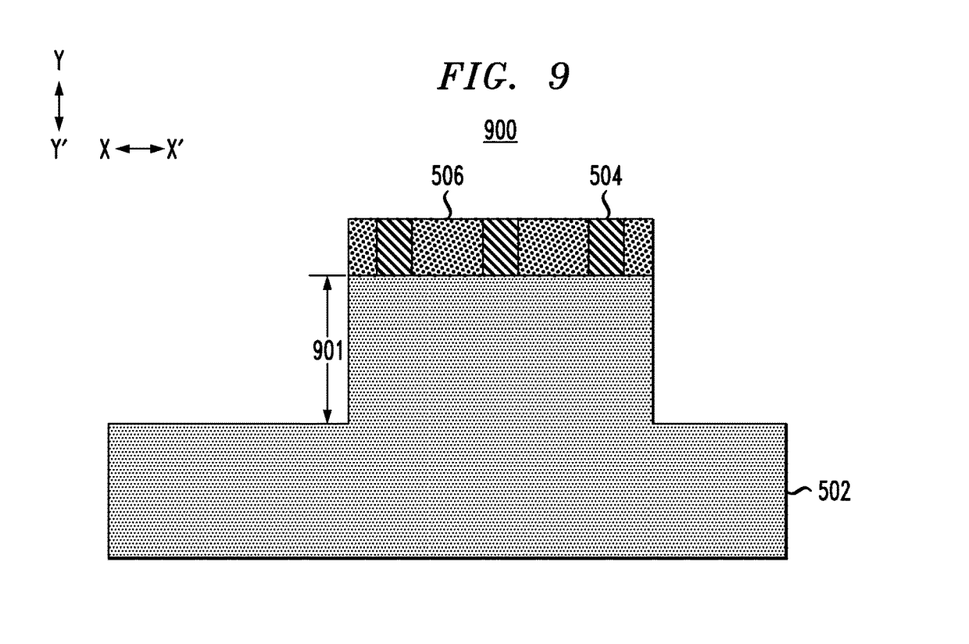
FIG. 9 depicts a side cross-sectional view of the FIG. 8 structure following etching of portions of the substrate exposed by the fin cut mask, according to an embodiment of the invention.

FIG. 9 depicts a side cross-sectional view 900 of the FIG. 8 structure following etching portions of the substrate 502 exposed by the fin cut mask 506. The substrate 502 may be etched to a depth 901 in the range 50 nm to 80 nm, although other suitable depths outside this range may be used as desired for a particular application. The substrate 502 may be etched using RIE processing. Depending on the materials of the fin cut mask 506 and substrate 502 and the substrate, etching into the substrate 502 may also etch a portion of the fin cut mask 506 down to a top surface of the remaining hard mask pillars 504. If the right fin cut mask 506 material is selected, and the vertical height of the fin cut mask 506 is such that during etching of the substrate 502 the portion of the fin cut mask 506 above the hard mask pillars 504 is substantially consumed, then a same etch process may be used to arrive at the structure shown in FIG. 9 (e.g., a top of the remaining fin cut mask 506 is substantially coplanar with a top surface of the hard mask pillars 504). For example, a RIE process may be used to remove a substantial amount of the fin cut mask 504 above the hard mask pillars 504. The top surface of the fin cut mask 504 and the top surfaces of the hard mask pillars 504 need not be perfectly coplanar.

Figure 10:
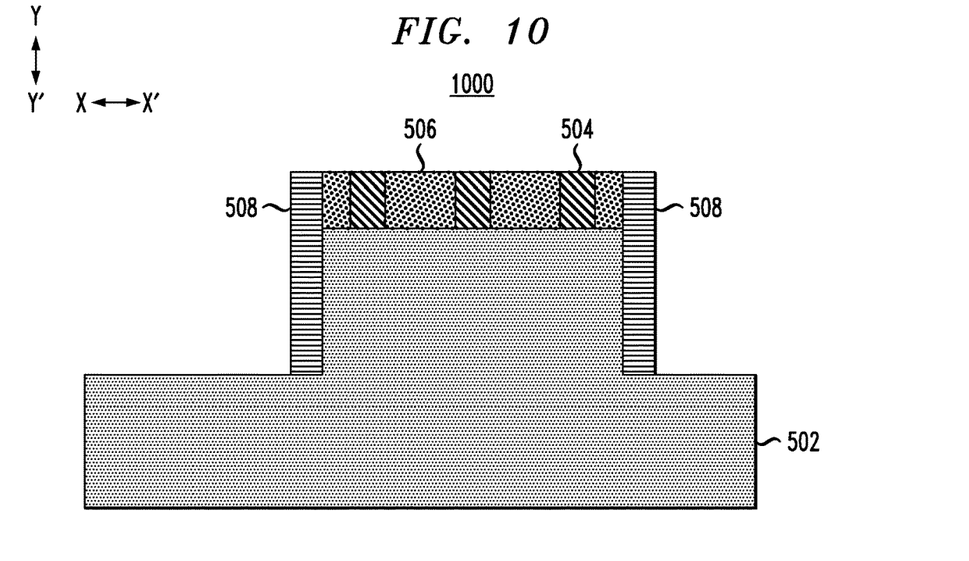
FIG. 10 depicts a side cross-sectional view of the FIG. 9 structure following deposition and etch back of a spacer on sidewalls of the substrate and fin cut mask in the fin region, according to an embodiment of the invention.

FIG. 10 depicts a side cross-sectional view 1000 of the FIG. 9 structure, following deposition and etch back of spacers 508 on sidewalls of the substrate 502 and fin cut mask 506 in the fin cut region as shown. The spacers 508 thus vertically abut sidewalls of the fin region, and form the stepped height structure of the fin region in the final structure as will be described in further detail below. The spacers 508 may be formed of insulator material such as silicon oxide (SiO) although other suitable materials may be used. The spacers 508 can be formed by deposition followed by RIE processing. In some embodiments, the spacers 508 are formed of a same material as shallow trench isolation (STI) regions formed in subsequent processing described in further detail below with respect to FIGS. 14-16 and 18-19.

Figure 11:
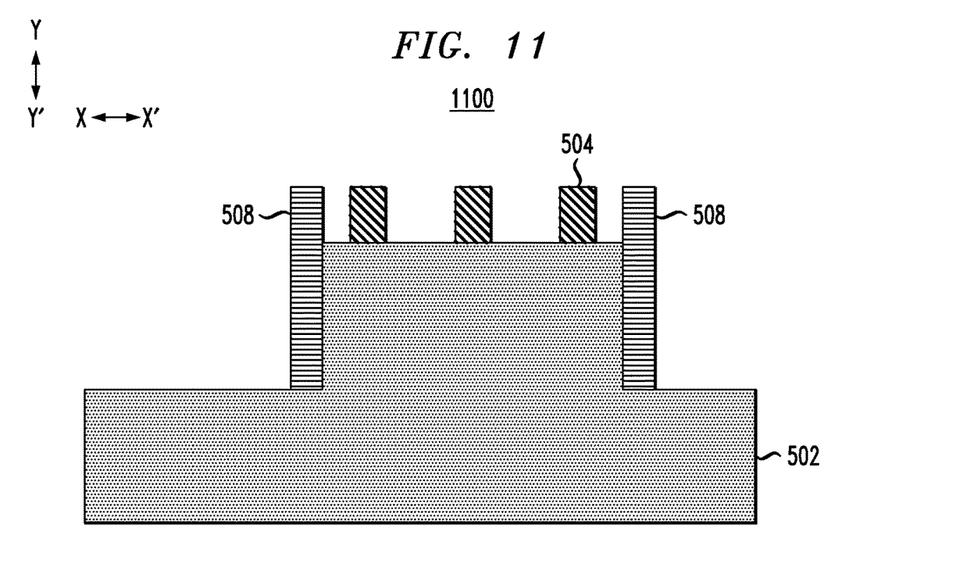
FIG. 11 depicts a side cross-sectional view of the FIG. 10 structure following removal of the fin cut mask, according to an embodiment of the invention.

FIG. 11 depicts a side cross-sectional view 1100 of the FIG. 10 structure following removal of the fin cut mask 506. The fin cut mask 506 may be removed by any suitable etch processing. For example, if the fin cut mask 506 is amorphous carbon, it can be removed by a plasma etch process containing oxygen.

Figure 12:
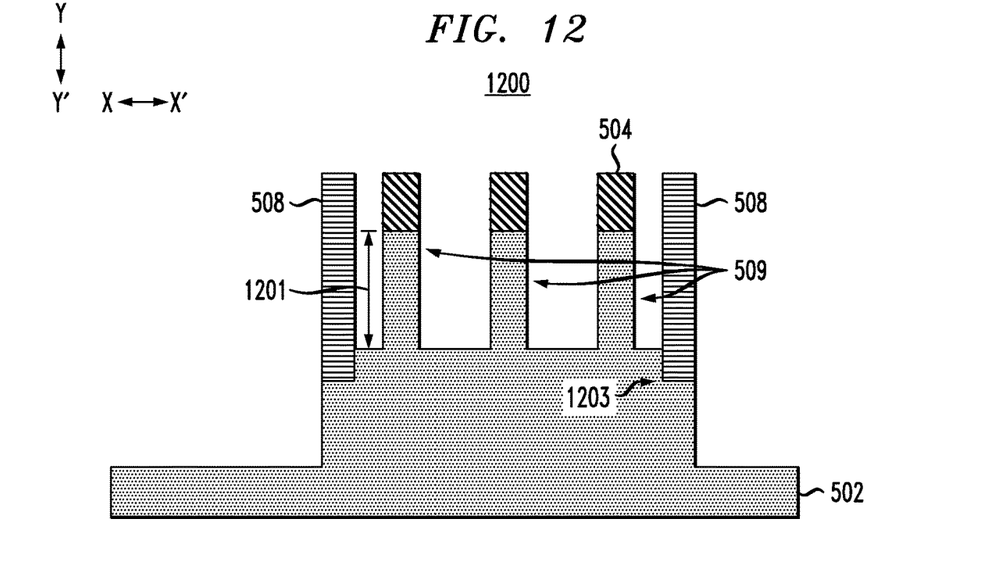
FIG. 12 depicts a side cross-sectional view of the FIG. 11 structure following fin formation, according to an embodiment of the invention.

FIG. 12 depicts a side cross-sectional view 1200 of the FIG. 11 structure following formation of fins 509 by further etching of exposed portions of the substrate 502, both in the fin cut region or fin region and outside the fin cut region or in the non-fin region surrounding the fin region. The substrate 502 may be etched using RIE processing. Each of the fins 509 may have a height or vertical thickness 1201 in the range of 30 nm to 60 nm, although other heights that are greater or less than this range may be employed as desired depending on the particular application. Formation of the fins 509 also results in the stepped height structure of the substrate 502 in the fin region, as illustrated by the step feature 1203 at the bottom of the substrate 502 between the fin region and the non-fin region.

Figure 17:
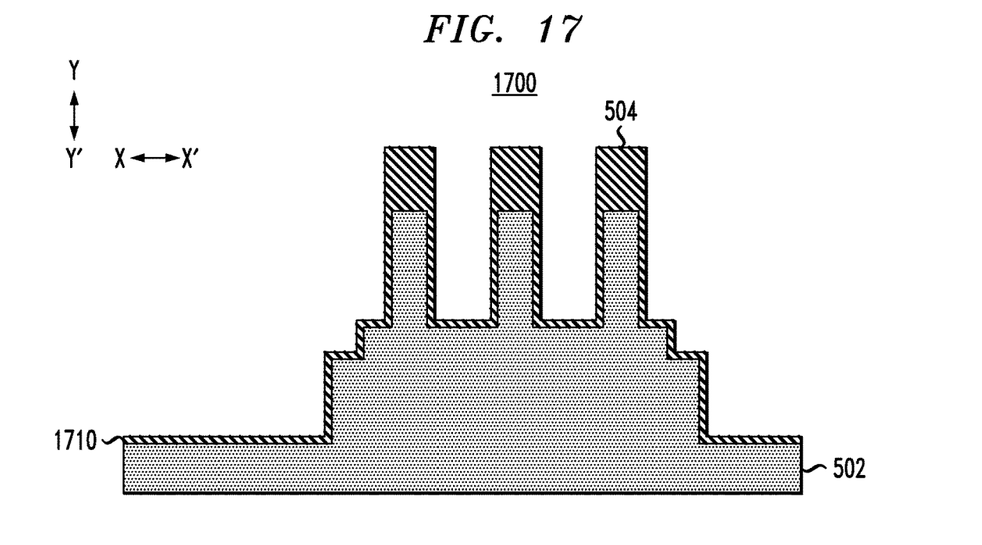
FIG. 17 depicts a side cross-sectional view of the FIG. 12 structure following removal of the spacer and formation of a fin liner, according to an embodiment of the invention.
Figure 18:
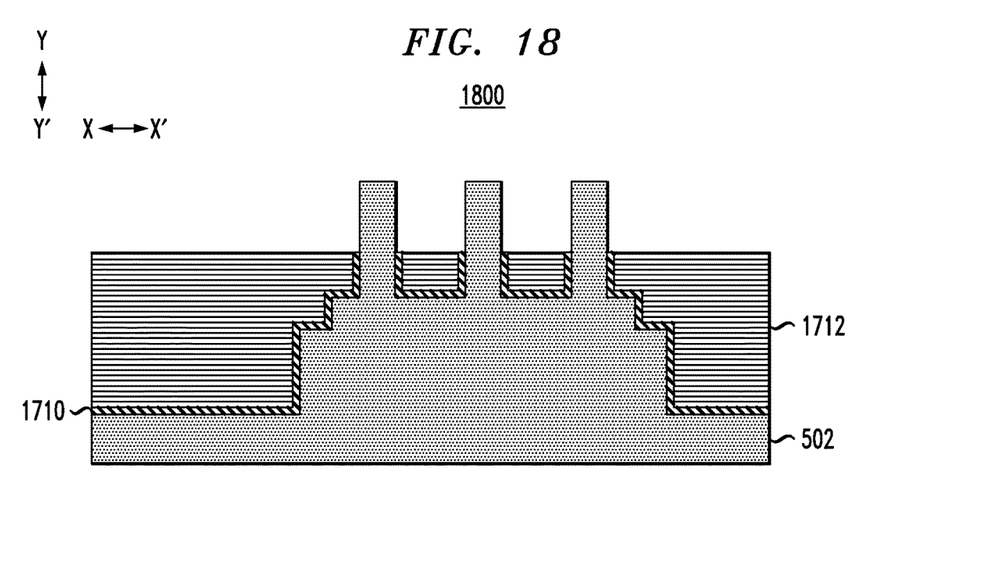
FIG. 18 depicts a side cross-sectional view of the FIG. 17 structure following fill, planarization and recess of an isolation layer, and following removal of remaining portions of the hard mask and the fin liner exposed by recess of the isolation layer, according to an embodiment of the invention.
Figure 19A:
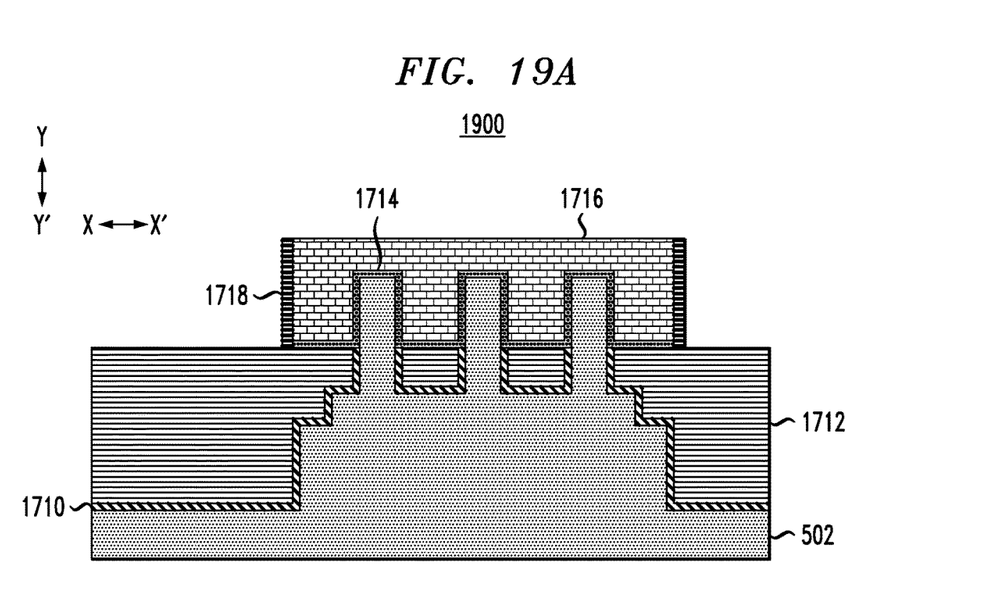
FIG. 19A depicts a side cross-sectional view of the FIG. 18 structure following FinFET fabrication, according to an embodiment of the invention.
Figure 19B:
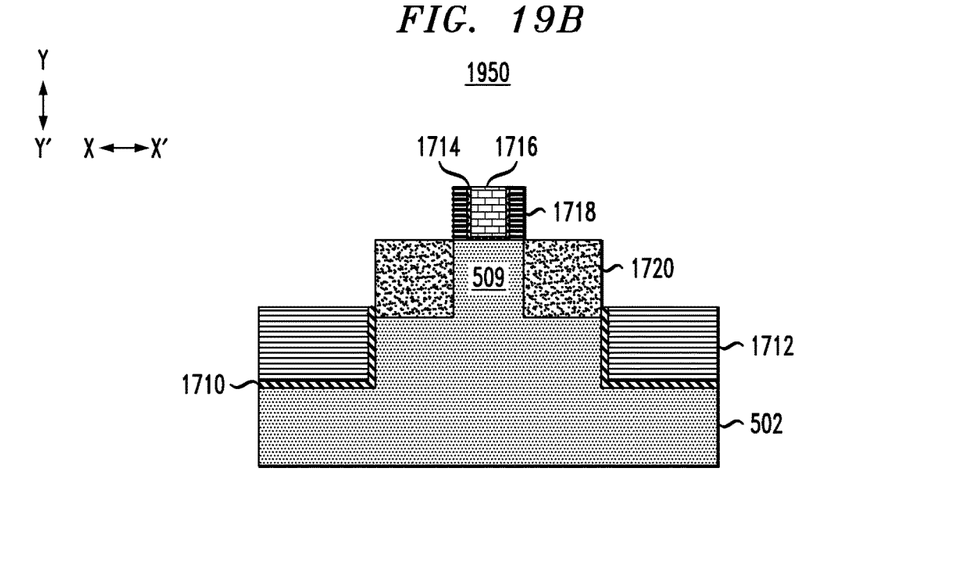
FIG. 19B depicts another side cross-sectional view of the FIG. 18 structure following FinFET fabrication, according to an embodiment of the invention.
Figure 19C:
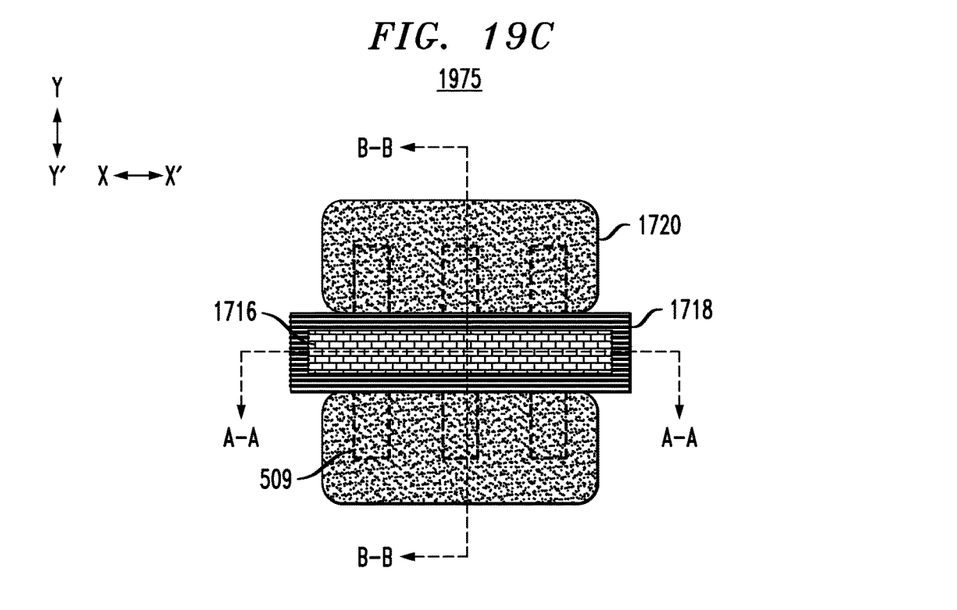
FIG. 19C depicts a top-down view of the structure shown in FIGS. 19A and 19B, according to an embodiment of the invention.

The structure shown in FIG. 12 may be subject to further processing for formation of a fin liner and STI regions, and for FinFET fabrication. FIGS. 13-16 illustrate one option for such processing, and FIGS. 17-19 illustrate another option for such processing.

Figure 13:
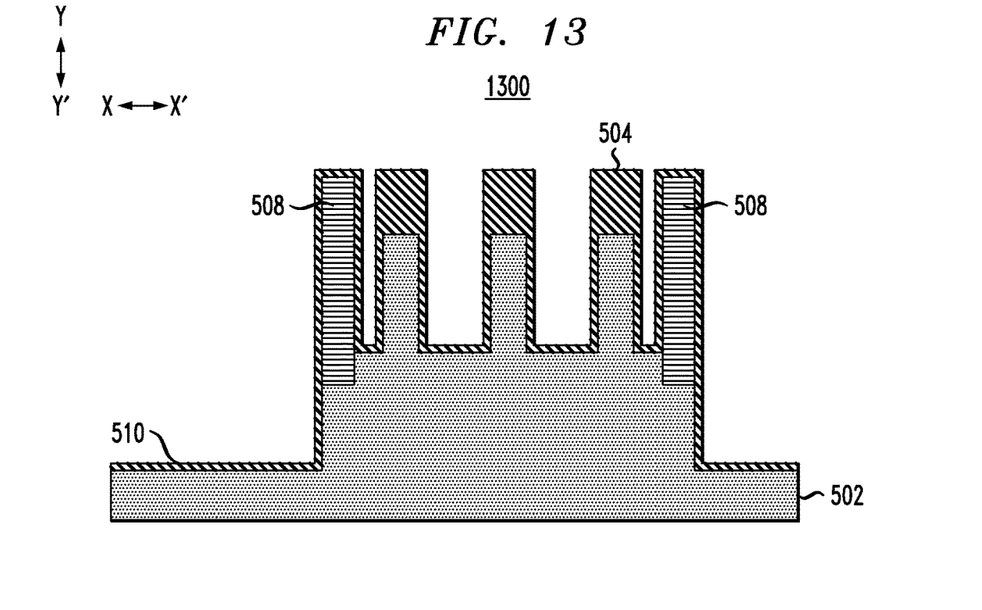
FIG. 13 depicts a side cross-sectional view of the FIG. 12 structure following deposition of a fin liner, according to an embodiment of the invention.

FIG. 13 depicts a side cross-sectional view 1300 of the FIG. 12 structure following deposition of a fin liner 510. The fin liner 510 is formed over the exposed portions of the substrate 502, the spacers 508 and fins 509. The fin liner 510 may be formed of SiN or another suitable material, using processing such as CVD or ALD processing. The fin liner 510 may be formed with a uniform thickness in the range of 3 nm to 10 nm, although other thickness that are greater or less than this range may be employed as desired depending on the particular application.

Figure 14:
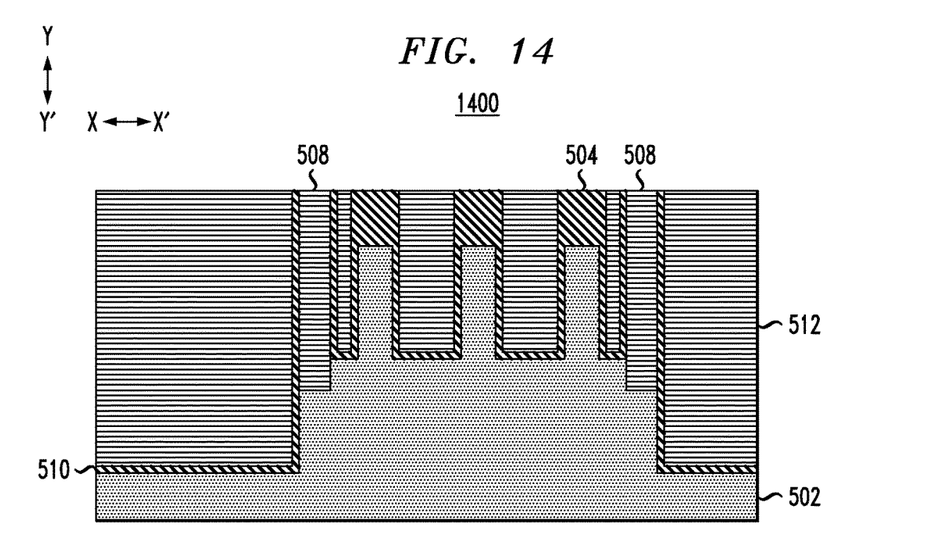
FIG. 14 depicts a side cross-sectional view of the FIG. 13 structure following fill and planarization of an isolation layer, according to an embodiment of the invention.

FIG. 14 depicts a side cross-sectional view 1400 of the FIG. 13 structure following fill and planarization of an isolation layer 512. The isolation layer 512, which forms STI regions after further recess illustrated in FIG. 15, may be formed of SiO, although other suitable materials may be used. The isolation layer 512 may be filled using CVD, PECVD, HDPCVD, spin-on, or other suitable processing, and may be planarized using processing such as chemical mechanical polishing or planarization (CMP). In some embodiments, additional processing such as thermal annealing and ultraviolet (UV) treatment can be performed after deposition and/or after planarization to improve the quality of the isolation layer 512.

Figure 15:
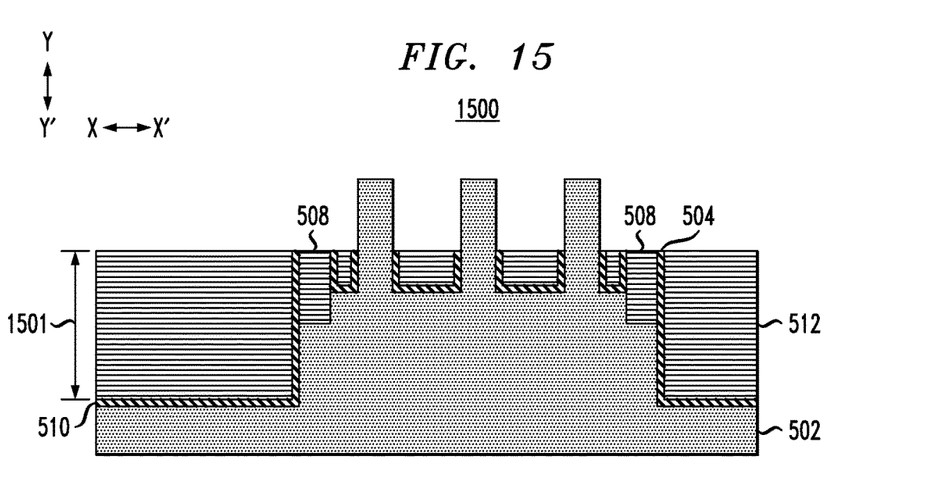
FIG. 15 depicts a side cross-sectional view of the FIG. 14 structure following recess of the isolation layer, removal of remaining portions of the hard mask, and removal of the fin liner exposed by recess of the isolation layer, according to an embodiment of the invention.

FIG. 15 depicts a side cross-sectional view 1500 of the FIG. 14 structure following recess of the isolation layer 512, as well as removal of the remaining hard mask pillars 504 and potions of the fin liner 510 exposed by recess of the isolation layer 512. The remaining isolation layer 512 forms STI regions for FinFET devices that are fabricated from the FIG. 15 structure. The isolation layer 512 may be recessed using wet etch (e.g., hydrogen fluoride acid), dry etch (e.g., ME, chemical oxide removal), or any suitable combination of these processes and other suitable processes. The isolation layer 512 may be recessed to have a height or vertical thickness 1501 in the range of 50 nm to 150 nm, although other heights that are greater or less than this range may be employed as desired depending on the particular application.

The remaining hard mask pillars 504 may be removed using any suitable etch processing, and the fin liner 510 exposed by recess of the isolation layer 512 may be removed using any suitable etch processing. For example, if the hard mask pillars 504 and the fin liner 510 are SiN, they can be removed by wet etch containing phosphoric acid, or selective SiN dry etch processing.

Figure 16A:
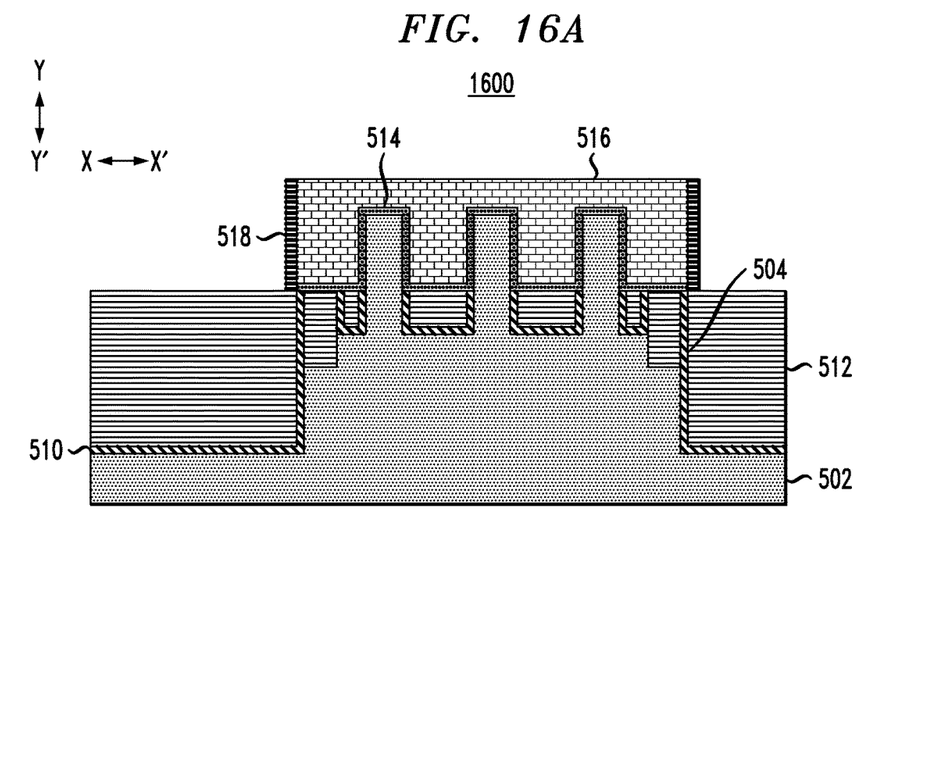
FIG. 16A depicts a side cross-sectional view of the FIG. 15 structure following fin field-effect transistor (FinFET) fabrication, according to an embodiment of the invention.
Figure 16B:
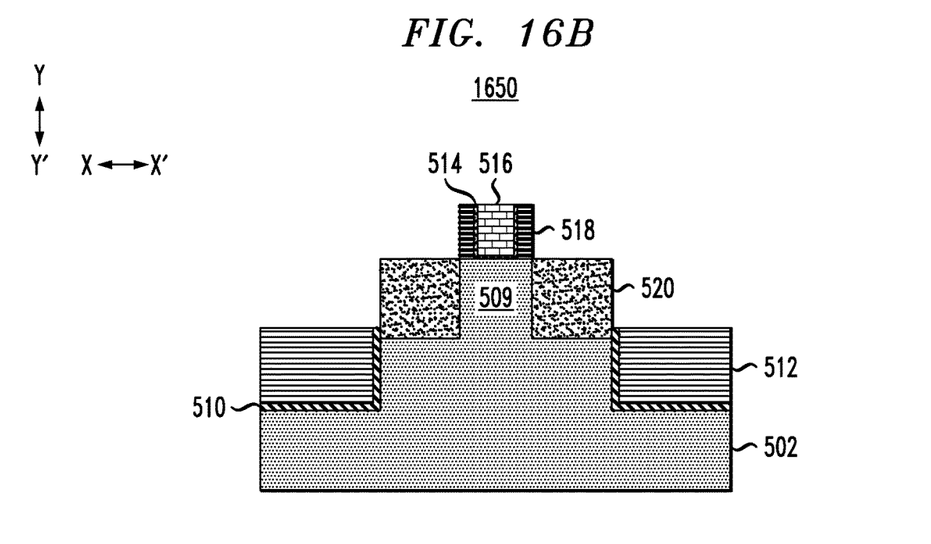
FIG. 16B depicts another side cross-sectional view of the FIG. 15 structure following FinFET fabrication, according to an embodiment of the invention.
Figure 16C:
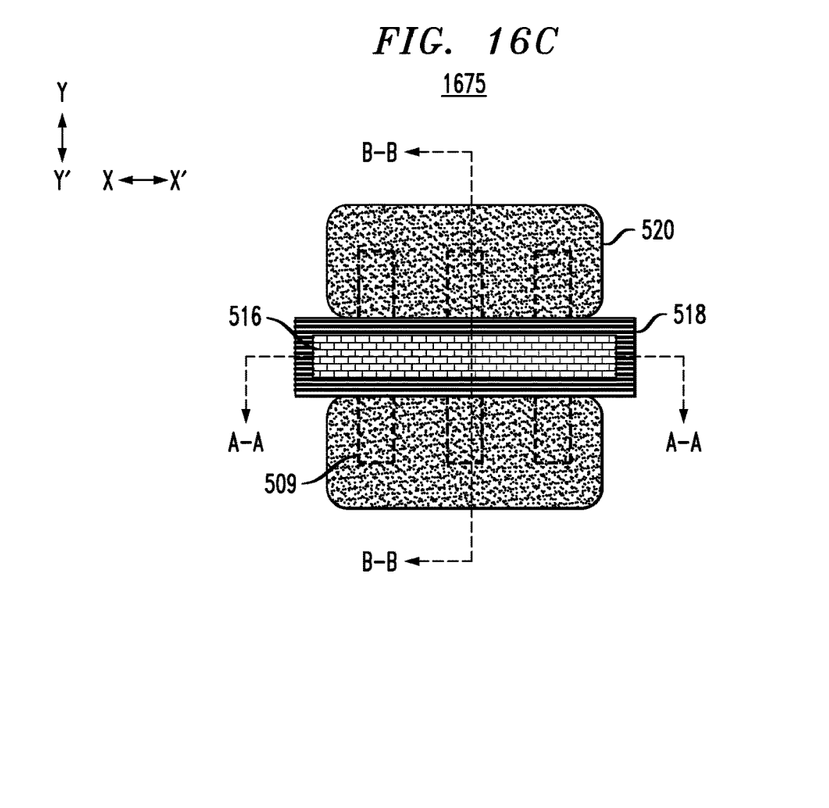
FIG. 16C depicts a top-down view of the structure shown in FIGS. 16A and 16B, according to an embodiment of the invention.

FIG. 16A depicts a side cross-sectional view 1600 of the FIG. 15 structure following FinFET fabrication. FIG. 16B depicts another side cross-sectional view 1650 of the FIG. 15 structure following FinFET fabrication. The side cross-sectional view 1600 is taken along the line A-A in the top-down view 1675 of FIG. 16C, and the side cross-sectional view 1650 is taken along the line B-B in the top-down view 1675 of FIG. 16C. FIGS. 16A-16C illustrate a gate dielectric 514, gate conductor 516, gate spacer 518 and source/drain regions 520. The structure shown in FIGS. 16A-16C may be subject to further processing not shown, such as for forming contacts, wires, etc. for a FinFET device.

The gate dielectric 514 is formed on exposed sidewalls of the fins 509, and over portions of the isolation layer 512 and remaining fin liner 510 in the fin cut region or fin region. The gate dielectric 514 may be formed of SiO, SiN, SiON, high-k materials, or any combination of these materials. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k may further include dopants such as lanthanum (La), aluminum (Al), and magnesium (Mg). The gate dielectric 514 may be formed using ALD or CVD processing, although other suitable processes may be used. The gate dielectric 514 may have a uniform thickness in the range of 1 nm to 3 nm, although other thicknesses that are greater or less than this range may be employed as desired depending on the particular application.

The gate conductor 516 is formed over the gate dielectric 514 in the fin cut or fin region. The gate conductor 516 may be formed of any suitable conducting material, including but not limited to, doped polycrystalline or amorphous silicon, germanium (Ge), silicon germanium (SiGe), a metal (e.g., tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), gold (Au), etc.), a conducting metallic compound material (e.g., tantalum nitride (TaN), titanium nitride (TiN), tantalum carbide (TaCx), titanium carbide (TiC), titanium aluminum carbide, tungsten silicide ($WSi_2$), tungsten nitride (WN), ruthenium oxide ($RuO_2$), cobalt silicide, nickel silicide, etc.), carbon nanotubes, conductive carbon, graphene, or any suitable combination of these materials. The conductive material may further comprise dopants that are incorporated during or after deposition. In some embodiments, the gate conductor 516 includes a work function metal (WFM) layer to set the threshold voltage of the transistor to a desired value. The WFM may be: a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC); and combinations thereof.

The gate conductor 516 may be formed using ALD, CVD, plating, sputtering, PVD or other suitable processing. The gate conductor 516 may have a height or vertical thickness (in direction Y-Y'), measured from a top surface of isolation layer 512, in the range of 50 nm to 100 nm, although other heights that are greater or less than this range may be employed as desired depending on the particular application. The gate can be formed by any suitable gate formation processing such as so-called "gate-first", "gate-last", or "replacement metal gate" processing.

The gate spacer 518 surrounds the gate conductor 516 and gate dielectric 514 over each of the fins 509 as illustrated in FIGS. 16A-16C. The gate spacer 518 may be formed of an oxide such as SiO, a nitride such as SiN, an oxynitride such as SiON, SiOC, SiBCN, SiCN, or combinations thereof, although other suitable materials may be used. The gate spacer 518 may be formed using deposition (e.g., CVD, ALD, PECVD, etc.) followed by RIE processing. The gate spacer 518 may have a uniform thickness surrounding the gate conductor 516 and gate dielectric 514 (as illustrated in FIG. 16C) in the range of 3 nm to 10 nm, although other thicknesses that are greater or less than this range may be employed as desired depending on the particular application.

Source/drain regions 520 may be formed by epitaxy processing. Dopants can be incorporated in the source/drain regions 520, for example, during source/drain epitaxy processing. Such a doping technique is so-called in-situ doping. Other doping techniques include but are not limited to, ion implantation, gas phase doping, plasma doping, plasma immersion ion implantation, cluster doping, infusion doping, liquid phase doping, solid phase doping, etc.

The fins 509 are shown in the cross-sectional view 1650 of FIG. 16B. The fins 509 are also shown in white dashed outline in the top-down view 1675 of FIG. 16C.

FIG. 17 depicts a side cross-sectional view 1700 of the FIG. 12 structure following removal of the spacers 508 and formation of fin liner 1710. The spacers 508 may be removed using any suitable processing. For example, if the spacers 508 are formed of SiO, the spacers 508 can be removed by a wet etch process containing hydrogen fluoride acid, or chemical oxide removal processing. The fin liner 1710 may be formed of similar materials, using similar processing, and with similar size as the fin liner 510. As compared with the structure of FIG. 13, the fin liner 1710 is not formed on sidewalls of spacers 508, as the spacers 508 are removed prior to formation of the fin liner 1710.

FIG. 18 depicts a side cross-sectional view 1800 of the FIG. 17 structure following fill and recess of isolation layer 1712. The isolation layer 1712 forms STI regions for a FinFET device, and may be formed and recessed using processing similar to that of the isolation layer 512.

FIG. 19A depicts a side cross-sectional view 1900 of the FIG. 18 structure following FinFET fabrication. FIG. 19B depicts another side cross-sectional view 1950 of the FIG. 18 structure following FinFET fabrication. The side cross-sectional view 1900 is taken along the line A-A in the top-down view 1975 of FIG. 19C, and the side cross-sectional view 1950 is taken along the line B-B in the top-down view 1975 of FIG. 19C. FIGS. 19A-19C illustrate show a gate dielectric 514, gate conductor 516, gate spacer 518 and source/drain regions 520 similar to that of FIGS. 16A-16C, although the underlying STI region 1712 in FIG. 19A-19C does not include vertical pillars of the fin liner 510 surrounding spacers 508 in the fin cut region as the spacers 508 are removed prior to formation of fin liner 1710 as discussed above. The structure shown in FIGS. 19A-19C may be subject to further processing not shown, such as for forming contacts, wires, etc. for a FinFET device.

In some embodiments, a method of forming a semiconductor structure comprises forming a fin region and a non-fin region surrounding the fin region in a substrate, wherein sidewalls of the fin region comprise a stepped height structure comprising an outer portion adjacent to the non-fin region with a first height and an inner portion with a second height greater than the first height. The method also comprises forming a plurality of fins disposed over a top surface of the inner portion of the fin region, forming an isolation layer disposed over the top surface of the inner portion of the fin region surrounding a portion of the sidewalls of the plurality of fins, and forming a fin liner disposed (i) between the isolation layer and the top surface of the inner portion of the fin region and (ii) between the isolation layer and the portion of the sidewalls of the plurality of fins.

In some embodiments, the method further comprises forming the substrate, forming a hard mask disposed over a top surface of the substrate, patterning the hard mask to form a plurality of hard mask pillars disposed over the top surface of the substrate, forming a fin cut mask disposed over a top surface of the substrate and at least a subset of the plurality of hard mask pillars, the fin cut mask defining the fin region, and removing hard mask pillars exposed by the fin cut mask.

Forming the fin region and the non-fin region may comprise etching portions of the substrate exposed by the fin cut mask, forming spacers disposed on sidewalls of the substrate and fin cut mask, and removing the fin cut mask. The method may further comprise etching the substrate, wherein etching the substrate forms the plurality of fins by etching in the fin region and forms the non-fin region by recessing a top surface of the substrate outside the fin region below a bottom surface of the spacers. The spacers may reduce microloading effects during etching of the substrate, such that the plurality of fins have uniform channel dimension.

In some embodiments, forming the fin liner comprises forming the fin liner over the top surface of the substrate, over the spacers and surrounding exposed sidewalls of the plurality of fins. Forming the isolation layer may comprise depositing the isolation layer over the fin liner and over a top surface of the hard mask pillars, planarizing a top surface of the isolation layer to match a top surface of the hard mask pillars, and recessing the isolation layer and spacers below a bottom surface of the hard mask pillars to expose the fin liner on portions of the sidewalls of the plurality of fins. Remaining portions of the spacers may form part of the isolation layer. Forming the fin liner may further comprise removing the hard mask pillars and removing the exposed fin liner.

In other embodiments, forming the fin liner comprises removing the spacers and forming the fin liner over the substrate and on sidewalls of the plurality of fins. Forming the isolation layer may comprise depositing the isolation layer over the fin liner and over a top surface of the hard mask pillars, planarizing a top surface of the isolation layer to match a top surface of the hard mask pillars, and recessing the isolation layer below a bottom surface of the hard mask pillars to expose the fin liner on portions of the sidewalls of the plurality of fins. Forming the fin liner may further comprise removing the hard mask pillars and removing the exposed fin liner.

The method may further comprise forming a gate dielectric over a portion of the plurality of fins and the isolation layer in the fin region, forming a gate conductor over the gate dielectric, forming a gate spacer surrounding the gate dielectric and the gate conductor, and forming source/drain regions over the top surface of the substrate in the fin region surrounding the gate spacer.

In some embodiments, a semiconductor structure comprises a substrate comprising a fin region and a non-fin region surrounding the fin region, wherein sidewalls of the fin region comprise a stepped height structure comprising an outer portion adjacent to the non-fin region with a first height and an inner portion with a second height greater than the first height. The semiconductor structure also comprises a plurality of fins disposed over a top surface of the inner portion of the fin region, an isolation layer disposed over the top surface of the inner portion of the fin region surrounding a portion of the sidewalls of the plurality of fins, and a fin liner disposed (i) between the isolation layer and the top surface of the inner portion of the fin region and (ii) between the isolation layer and the portion of the sidewalls of the plurality of fins. The plurality of fins may have uniform CD.

The fin liner may comprise vertical portions disposed in the isolation layer over the step structure. The isolation layer may be further disposed over the top surface of the substrate in the non-fin region, and the fin liner may be further disposed between the isolation layer and the top surface of the substrate in the non-fin region.

The semiconductor structure may further comprise a gate dielectric disposed over a portion of the plurality of fins and the isolation layer in the fin region, a gate conductor disposed over the gate dielectric, a gate spacer surrounding the gate dielectric and the gate conductor, and source/drain regions disposed over the top surface of the substrate in the fin region surrounding the gate spacer.

In some embodiments, an integrated circuit comprises a FinFET device comprising a substrate comprising a fin region and a non-fin region surrounding the fin region, wherein sidewalls of the fin region comprise a stepped height structure comprising an outer portion adjacent to the non-fin region with a first height and an inner portion with a second height greater than the first height. The FinFET device also comprises a plurality of fins disposed over a top surface of the inner portion of the fin region, an isolation layer disposed over the top surface of the inner portion of the fin region surrounding a portion of the sidewalls of the plurality of fins, and a fin liner disposed (i) between the isolation layer and the top surface of the inner portion of the fin region and (ii) between the isolation layer and the portion of the sidewalls of the plurality of fins. The FinFET device may further comprise a gate dielectric disposed over a portion of the plurality of fins and the isolation layer in the fin region, a gate conductor disposed over the gate dielectric, a gate spacer surrounding the gate dielectric and the gate conductor, and source/drain regions disposed over the top surface of the substrate in the fin region surrounding the gate spacer.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a substrate;
    forming a hard mask disposed over a top surface of the substrate;
    patterning the hard mask to form a plurality of hard mask pillars disposed over the top surface of the substrate;
    forming a fin cut mask disposed over the top surface of the substrate and at least a subset of the plurality of hard mask pillars, the fin cut mask defining a fin region;
    removing hard mask pillars exposed by the fin cut mask;
    forming the fin region and a non-fin region surrounding the fin region in the substrate, wherein sidewalls of the fin region comprise a stepped height structure comprising an outer portion adjacent to the non-fin region with a first height and an inner portion with a second height greater than the first height, wherein forming the fin region and the non-fin region comprises:
        etching portions of the substrate exposed by the fin cut mask;
        forming spacers disposed on sidewalls of the substrate and fin cut mask; and
        removing the fin cut mask;
    forming a plurality of fins disposed over a top surface of the inner portion of the fin region by etching the substrate, wherein etching the substrate forms the plurality of fins by etching in the fin region and forms the non-fin region by recessing a top surface of the substrate outside the fin region below a bottom surface of the spacers;

forming an isolation layer disposed over the top surface of the inner portion of the fin region surrounding a portion of the sidewalls of the plurality of fins; and forming a fin liner disposed (i) between the isolation layer and the top surface of the inner portion of the fin region and (ii) between the isolation layer and the portion of the sidewalls of the plurality of fins.

2. The method of claim 1, wherein the spacers reduce micro-loading effects during etching of the substrate, such that the plurality of fins have uniform channel dimension.

3. The method of claim 1, wherein forming the fin liner comprises forming the fin liner over the top surface of the substrate, over the spacers and surrounding exposed sidewalls of the plurality of fins.

4. The method of claim 3, wherein forming the isolation layer comprises:

depositing the isolation layer over the fin liner and over a top surface of the hard mask pillars;

planarizing a top surface of the isolation layer to match a top surface of the hard mask pillars; and recessing the isolation layer and spacers below a bottom surface of the hard mask pillars to expose the fin liner on portions of the sidewalls of the plurality of fins.

5. The method of claim 4, wherein remaining portions of the spacers form part of the isolation layer.

6. The method of claim 4, wherein forming the fin liner further comprises:

removing the hard mask pillars; and
removing the exposed fin liner.

7. The method of claim 6, wherein forming the isolation layer comprises:

depositing the isolation layer over the fin liner and over a top surface of the hard mask pillars;

planarizing a top surface of the isolation layer to match a top surface of the hard mask pillars; and recessing the isolation layer below a bottom surface of the hard mask pillars to expose the fin liner on portions of the sidewalls of the plurality of fins.

8. The method of claim 1, wherein forming the fin liner comprises:

removing the spacers; and
forming the fin liner over the substrate and on sidewalls of the plurality of fins.

9. The method of claim 8, wherein forming the fin liner further comprises:

removing the hard mask pillars; and
removing the exposed fin liner.

10. The method of claim 1, further comprising:

forming a gate dielectric over a portion of the plurality of fins and the isolation layer in the fin region;

forming a gate conductor over the gate dielectric;

forming a gate spacer surrounding the gate dielectric and the gate conductor; and forming source/drain regions over the top surface of the substrate in the fin region surrounding the gate spacer.

* * * * *